May 1, 1973 J. W. SCANNELL 3,730,799
METHOD FOR METALLIC PATTERN DEFINITION
Filed July 7, 1971

INVENTOR
JACK W. SCANNELL
BY
ATTORNEY

United States Patent Office 3,730,799
Patented May 1, 1973

3,730,799
METHOD FOR METALLIC PATTERN DEFINITION

Jack W. Scannell, Richardson, Tex., assignor to Collins Radio Company, Dallas, Tex.
Filed July 7, 1971, Ser. No. 160,386
Int. Cl. C23f *1/02;* H05k *3/06*
U.S. Cl. 156—5 1 Claim

ABSTRACT OF THE DISCLOSURE

A metallic pattern definition system with improved tolerances wherein a plated substrate is emersed in an etchant solution and a vortex is established in said solution centered generally over said substrate. A rotatable substrate holder with magnetic induction means may be employed in establishing said vortex.

This invention relates to metallic pattern definition systems, and particularly to an improved method and means for defining metallic patterns on substrates through selective etch processes.

In defining metallic patterns on substrates, such as in the microelectronics industry for example, the use of photoresist masking and etching techniques is well recognized. Typically, an electrical conductor pattern is defined on a base substrate by first plating a metallic layer such as gold or aluminum on a surface of the substrate, protectively photoresist masking portions of the metallic layer in the desired circuit pattern, and then removing the exposed metallic layer by emersion in a suitable etchant.

In order to speed the etching process, and to reduce "undercut" or etchant action on the masked metal, agitation of the etchant solution is normally provided manually by a technician or by providing mechanical stirring of the solution. An example of the latter is the spinning hot plate manufactured by Corning Glass Works, model PC351, which magnetically induces a spinning action on a stir bar provided in an etchant containing beaker or the like positioned on the hot plate. In this system, the plated substrates are stationarily, submersibly placed in the beaker around the stir bar, and the rotating action of the stir bar provides flow of etchant over the substrates. However, particularly in microwave circuit applications this etch-back system has proved less than satisfactory due to the uneven etchant flow over the substrate and variable etch rate on the metal. Thus, undercutting remains an acute problem.

An object of the present invention is an improved method and means for etching metallic patterns.

Another object of the invention is a method of defining metallic patterns with improved pattern tolerances, especially in microwave circuit applications.

Still another object of the invention is rotatable support means for use in carrying out the etch-back process in accordance with the invention.

Features of the invention include establishing an etchant layer over a plated substrate which has an increasing thickness or depth outwardly from the central portion of the substrate thereby increasing pressure and etch rate near the periphery of the metal plating. A substrate holder which advantageouly establishes such an etchant configuration over a plated substrate is provided with means for rotating the substrate within the etchant solution.

These and other objects and features of the invention will be more readily apparent from the following description and appended claim when taken with the drawings, in which:

Figure 1:
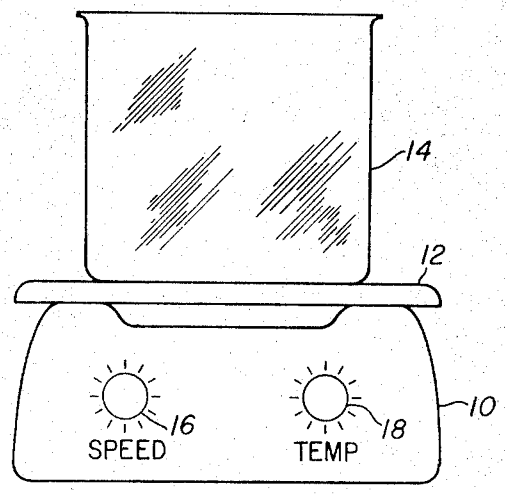
FIG. 1 is a plan view of conventional apparatus useful in metallic etching in accordance with the present invention.

Referring now to the drawings, FIG. 1 is a view of conventional apparatus used in metallic pattern definition systems and useful in carrying out the etch-back process in accordance with the present invention. Spinning hot plate 10, such as Corning Glass Works, model PC351, includes platform portion 12 upon which rests a beaker 14 or like container for etchant solution. Knobs 16 and 18 control the speed of rotation of a magnetic stir bar placed in beaker 14 and the temperature of the etchant solution, respectively.

Conventionally, a suitable magnetic stir bar, as available from E. H. Sargent and Company, is placed in the bottom of beaker 14; and spinning action is magnetically induced therein as shown in the cross section of beaker 14 in FIG. 2. Substrate carriers 22 are stationarily positioned in beaker 14 about stir bar 20, and the spinning action of bar 20 creates flow of the etchant solution 24 over the supported substrates. Importantly, it will be noted that the spinning action of bar 20 creates a vortex effect in the solution as noted by the surface 26 of the etchant solution 24.

While this agitation of the etchant solution does increase the speed of metal removal from the substrates, the etchant rate is not uniform over the substrate and thus the metal removal is not uniform over the plated layer on the substrate. Thus, in the areas of the plated layer where etching action is most rapid, considerable undercut or removal of metal from beneath the resist masking is accentuated. This problem is particularly acute in microwave circuit applications where conductor pattern tolerances are tight.

Figure 3:
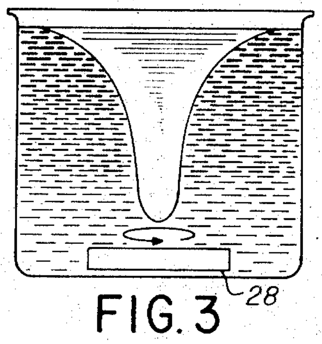
FIG. 3 is a section view of etchant for metallic pattern definition in accordance with the present invention.

In accordance with the present invention, more uniform control of the metal etch is made possible by creating the vortex pattern of the etchant solution above and generally centered about the substrate holder, as shown in FIG. 3. This may be accomplished either by rotating the substrate holder as illustrated in FIG. 3 or by stationarily positioning the holder in the bottom of the etchant container and rotating the container. The resulting pressure and fluid dynamics of this system greatly improves the uniformity of the metal etching on the substrate surface. As presently understood, it is believed that the Z force (the force perpendicular to the substrate) is reinforced by this system while the X and Y forces which affect the undercutting rate tend to cancel. Further, metal plating is inherently thicker near the periphery of a substrate than in the central portion and the increased pressure of the solution near the periphery increases slightly the etching rate in this thicker region.

Figure 2:
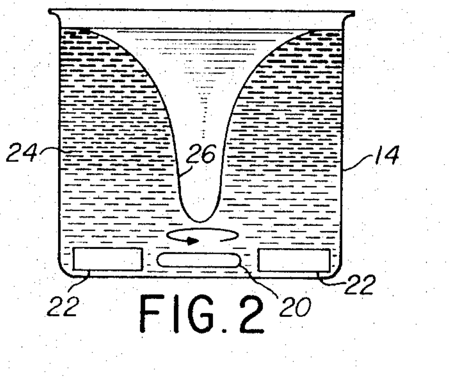
FIG. 2 is a section view of an etchant for metallic pattern definition as conventionally employed.

In one application, gold was etched in a Metex gold etch available from MacDermaid at 65° C. both conventionally as shown in FIG. 2 and in accordance with the present invention as shown in FIG. 3. In the conventional application, 12–15 minutes were required to etch the desired pattern and considerable undercutting was noted. With the present process, however, the etchant time was reduced to 9 minutes with considerably less undercut.

Figure 4:
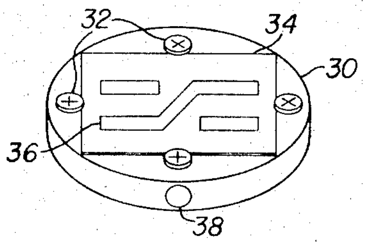
FIG. 4 is a perspective view of a rotatable substrate holder in accordance with the present invention.
Figure 5:
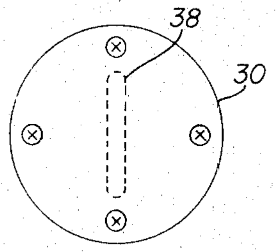
FIG. 5 is a top plan view of the substrate holder of FIG. 4 and illustrating the positioning of magnetic motivation means therein.

FIG. 4 is a perspective view of a loaded substrate holder in accordance with the present invention. The holder 30 is preferably made of Teflon, and four screws 32 are provided on a major surface to attach substrate 34 thereto while etching the desired metal pattern 36. A conventional magnetic stir bar is inserted inside of holder 30 through hole 38 provided therein. The position of stir bar 38 is illustrated by dotted line in the top view of holder 30 shown in FIG. 5.

Utilizing the method and means of metallic pattern definition in accordance with the present invention, improved microwave circuits have been produced. However, while the invention has been described with reference to specific embodiments and applications, the description is illustrative and is not to be construed as limiting the invention. Various modifications, changes, and applications may occur to those skilled in the art without departing from the spirit and scope of the invention as defined by the appended claim.

I claim:

1. The method of selectively etching a metallic pattern on a substrate comprising the steps of (a) masking the desired metallic pattern, (b) mounting said substrate on a substrate holder, (c) submersing said substrate and holder in a suitable etchant solution, and (d) spinning said substrate holder magnetically whereby a vortex is established in said etchant solution centered generally over said substrate.

References Cited

UNITED STATES PATENTS

| | | | |
|---|---|---|---|
| 2,735,232 | 2/1956 | Simjian | 51—7 |
| 2,801,909 | 8/1957 | Hirdler | 156—16 |

OTHER REFERENCES

Ultrasonic Batch Processing Apparatus, IBM Discl. Bulletin, p. 1076, vol. 13, No. 5, October 1970.

JACOB H. STEINBERG, Primary Examiner

U.S. Cl. X.R.

156—3, 345